(12) United States Patent
Melanson

(10) Patent No.: US 9,608,598 B1
(45) Date of Patent: Mar. 28, 2017

(54) CASCADED INTEGRATOR-COMB FILTER AS A NON-INTEGER SAMPLE RATE CONVERTER

(71) Applicant: Cirrus Logic International Semiconductor Ltd., Edinburgh (GB)

(72) Inventor: John L. Melanson, Austin, TX (US)

(73) Assignee: CIRRUS LOGIC, INC., Austin, TX (US)

( * ) Notice: Subject to any disclaimer, the term of this patent is extended or adjusted under 35 U.S.C. 154(b) by 0 days.

(21) Appl. No.: 14/946,675

(22) Filed: Nov. 19, 2015

(51) Int. Cl.
*H03M 7/00* (2006.01)
*H03H 17/04* (2006.01)

(52) U.S. Cl.
CPC .............................. *H03H 17/0427* (2013.01)

(58) Field of Classification Search
CPC ........... H03H 17/0671; H03H 17/0248; H03H 17/0294; H03H 17/0286; H03M 3/462; H03M 3/498; H03M 1/0631; H03M 1/1245; H03M 3/496
USPC .................................................. 341/61, 143
See application file for complete search history.

(56) References Cited

U.S. PATENT DOCUMENTS

| | | | | |
|---|---|---|---|---|
| 4,999,798 A | * | 3/1991 | McCaslin | H03H 17/0671 708/313 |
| 6,034,628 A | * | 3/2000 | Draxelmayr | H03H 17/0251 341/61 |
| 6,501,406 B1 | * | 12/2002 | Mecchia | H03H 7/0115 341/118 |
| 7,196,648 B1 | | 3/2007 | Ding et al. | |
| 7,242,326 B1 | | 7/2007 | Melanson et al. | |
| 7,262,716 B2 | * | 8/2007 | Yu | H03H 17/0628 341/61 |
| 7,324,025 B1 | * | 1/2008 | Ding | H03H 17/0671 341/118 |
| 7,750,832 B2 | * | 7/2010 | Noeske | H03H 17/0671 341/143 |
| 7,788,309 B2 | * | 8/2010 | Wu | H03H 17/0671 708/313 |
| 2002/0105447 A1 | * | 8/2002 | Freidhof | H03H 17/0288 341/61 |
| 2002/0105448 A1 | * | 8/2002 | Freidhof | H03H 17/0288 341/61 |
| 2005/0280564 A1 | * | 12/2005 | Lee | H03H 17/0671 341/61 |
| 2006/0103555 A1 | * | 5/2006 | Antonesei | H03H 17/0685 341/61 |

(Continued)

*Primary Examiner* — Linh Nguyen
(74) *Attorney, Agent, or Firm* — Norton Rose Fulbright US LLP

(57) ABSTRACT

The implementation of non-integer sample rate conversion and filtering of data sequences may be improved by performing both operations together with a system that includes a CIC filter and a control block that modifies internal states of the CIC filter. In one embodiment, input data samples provided at a first sample rate may be filtered by a CIC filter that includes a cascade of an integrating stage and a comb filter stage, each stage operating at a different sampling rate. A control block coupled to the CIC filter may modify at least one internal state of at least one of the integrating stage and comb filter stage of the CIC filter, wherein filtering by the CIC filter and modifying the at least one internal state causes the CIC filter to output data samples at a second sample rate unequal to the first sample rate.

18 Claims, 5 Drawing Sheets

(56) References Cited

U.S. PATENT DOCUMENTS

2009/0079600 A1\* 3/2009 Noeske .............. H03H 17/0685
　　　　　　　　　　　　　　　　　　　　　　　341/61

\* cited by examiner

CASCADED INTEGRATOR-COMB FILTER AS A NON-INTEGER SAMPLE RATE CONVERTER

REFERENCE TO COMPUTER PROGRAM LISTING APPENDIX

A computer program listing appendix is submitted herewith the Instant Application as the file cic_src.txt, which is hereby incorporated by reference.

FIELD OF THE DISCLOSURE

The instant disclosure relates to sample rate conversion. More specifically, portions of this disclosure relate to a cascaded integrator-comb (CIC) filter configured to operate as a non-integer sample rate converter.

BACKGROUND

Sample-rate conversion refers to the process of translating a sequence of discrete data samples with a certain sampling rate into another sequence with a different sampling rate, while preserving the information contained in the original sequence. Sample rate conversion can be a relatively simple technique where the two sample rates are related by fairly small integer values. For example, if the ratio of sample rates is 4:5, the input signal only needs to be upsampled by a factor of four and then, after appropriate filtering, downsampled by a factor of five.

FIG. 1 illustrates an example of such a prior art sample rate conversion technique. In FIG. 1, input data may be upsampled by a factor of M in upsampler 110, to produce an upsampled data stream. Upsampling may include the process of creating new intermediate samples by inserting intermediate samples. Upsampled data may be filtered in low pass filter 120, which may be a digital filter. The resultant data may be downsampled by a factor of N in downsampler 130. Downsampling may include decimating (eliminating) intermediate sample values to create a new sample set at the desired output sample rate. In the example given above for a ratio of sample rates of 4:5, M would equal 4 and N would equal 5.

The sample rate conversion technique illustrated in FIG. 1 may be suitable for relatively simple rate conversions, but not all applications where sample rate conversion is desired have such simple sample rate ratios. For example, one application in which the amount of processing required to upsample and then downsample may be prohibitive because of the drastic ratios (e.g., 124:359) that are common is asynchronous sample-rate conversion. The term "asynchronous sample-rate conversion" is often used to signify situations where the ratios are rather ill-defined numbers such that their least common multiple is a very large number. Asynchronous sample rate conversion is particularly applicable in cases where data is sampled by a sampling block clocked with a different clock rate than other components of the sample rate conversion block, thus likely having a slightly different sampling rate. For example, one set of data might have a sampling rate of 48 KHz, while another set of data might have a sampling rate of 48.23 KHz. Such ratios that are close to 1:1, but not exact, fall into the category of "asynchronous sample-rate conversion." Asynchronous sample rate converters (SRCs) may be used when bridging two systems that operate on different sampling rates and/or master operating clocks. Additionally, in audio applications, there are various standards that utilize different sampling rates, such as 32 KHz, 44.1 KHz, 48 KHz, and asynchronous SRCs may be used to interconnect different systems with the different standards. Because of the amount of processing required to handle the drastic ratios common in asynchronous sample-rate conversion applications, traditional SRCs, such as the SRC illustrated in FIG. 1, are costly to use for asynchronous sample-rate conversion applications, if used at all.

In some applications, a digital data stream may need to be filtered in addition to being converted to a different sampling frequency. One way to accomplish this task includes a sample rate conversion block followed by (or preceded by) a filter block. Such a setup is illustrated in FIG. 2. In the two systems of FIG. 2, an input signal u(k) 210 may be fed to a SRC 220 and a digital filter 230, in either order depending upon which side of the SRC the filtering is performed. SRC 220 alters the sample rate of the digital input data u(k) to a different sampling rate than the input signal, and may be either synchronous or asynchronous. Digital filter 230 may perform a number of digital filtering operations as desired by a user to alter the input signal. Output signal y(k) 240 is thus suitably filtered and converted for a desired end use.

FIG. 3 illustrates an example of a CIC digital filter which may be used as digital filter 230 in FIG. 2. A CIC filter may be used to perform digital filtering and integer sample rate conversion. In particular, CIC filter 300 includes a comb filter stage 302, an interpolator 304, and an integrating stage 306. By using the comb filter stage 302 to set the zeros of the CIC filter and the integrating stage 306 to set the poles of the CIC filter, the CIC filter may operate as a low pass filter. In addition, by using an interpolator 304 between the comb filter stage 302 and the integrating stage 306, the CIC filter 300 may also perform upsampling. The CIC filter 300 may also be used to perform downsampling while operating as a low pass filter by reversing the order of the stages and replacing the interpolator with a decimator. One primary drawback of CIC filter 300 is that it can only perform integer sample rate conversion and with a limited conversion range.

Although the systems of FIG. 2 may perform sample rate conversion and digital filtering, the systems of FIG. 2 require separate components and/or software for the digital filtering and sample rate conversion steps, such as the CIC filter illustrated in FIG. 3 and the traditional sample rate conversion scheme illustrated in FIG. 1, respectively. Thus, the solutions of FIG. 2 can be prohibitively complex for many applications. In addition, the solutions illustrated in FIGS. 2 and 3 do not resolve the limitations of the SRC block illustrated in FIG. 1 in performing complicated non-integer sample rate conversion.

Shortcomings mentioned here are only representative and are included simply to highlight that a need exists for improved electrical components, particularly for rate converters employed in consumer-level devices, such as mobile phones and media devices. Embodiments described herein address certain shortcomings but not necessarily each and every one described here or known in the art.

SUMMARY

The implementation of non-integer sample rate conversion and filtering of data sequences may be improved by performing both operations with a system that includes a CIC filter and a control block that modifies internal states of the CIC filter. Through modification of internal states of the CIC filter with the control block, the CIC filter can be configured to perform both filtering and difficult non-integer sample rate conversions, such as when the ratio of sample rates is a ratio of two large values.

According to one embodiment, a method of converting input data samples provided at a first sample rate to output data samples at a second sample rate unequal to the first sample rate may include filtering input data samples provided at a first sample rate by a CIC filter including a cascade of an integrating stage and a comb filter stage, each stage operating at a different sampling rate; and modifying at least one internal state of at least one of the integrating stage and comb filter stage of the CIC filter, wherein filtering by the CIC filter and modifying the at least one internal state causes the CIC filter to output data samples at a second sample rate unequal to the first sample rate. In some embodiments, the method may be performed using modular arithmetic techniques.

In some embodiments, modifying may include calculating the first sampling rate; determining a timing offset between the first sampling rate and a ratio of the second sampling rate based, at least in part, on the calculated first sampling rate; generating one or more correction factors based, at least in part, on the determined timing offset between the first sampling rate and a ratio of the second sampling rate; multiplying a difference in samples of the input data, obtained by sampling the input data samples at the first sampling rate, by each of the one or more correction factors to generate one or more input correction samples corresponding to the one or more correction factors; and adding the one or more input correction samples to one or more of the at least one internal state of the at least one of the integrating stage and comb filter state to modify the at least one internal state of the at least one of the integrating stage and comb filter stage of the CIC filter.

In certain embodiments, the one or more correction factors may include at least one of a linear, quadratic, and cubic correction factor. In addition, in some embodiments, the integrating stage may include one or more integrators coupled in series, and the comb filter stage may include one or more comb filters coupled in series.

In some embodiments, the comb filter stage operates at the second sampling rate and the integrating stage operates at a third sampling rate that is an integer ratio of the second sampling rate, wherein data output by the integrating stage is downsampled by sampling the data output by the integrating stage at the second sampling rate. In other embodiments, the integrating stage operates at the second sampling rate and the comb filter stage operates at a third sampling rate that is an integer ratio of the second sampling rate, wherein data output by the comb filter stage is upsampled by sampling the data output by the comb filter stage at the second sampling rate.

According to another embodiment, an apparatus may include a CIC filter that includes a cascade of an integrating stage and a comb filter stage, each stage operating at a different sampling rate, wherein the CIC is configured to filter input data samples provided at a first sample rate; and a control block coupled to the CIC, wherein the control block is configured to modify at least one internal state of at least one of the integrating stage and comb filter stage of the CIC filter, wherein the CIC filter is further configured to, in response to modification by the control block and filtering of the input data samples, output data samples at a second sample rate unequal to the first sample rate. In some embodiments, the CIC filter and the control block may be further configured to utilize modular arithmetic techniques while in operation.

In some embodiments, the control block may be further configured to perform the steps of: calculating the first sampling rate; determining a timing offset between the first sampling rate and a ratio of the second sampling rate based, at least in part, on the calculated first sampling rate; generating one or more correction factors based, at least in part, on the determined timing offset between the first sampling rate and a ratio of the second sampling rate; multiplying a difference in samples of the input data, obtained by sampling the input data samples at the first sampling rate, by each of the one or more correction factors to generate one or more input correction samples corresponding to the one or more correction factors; and adding the one or more input correction samples to one or more of the at least one internal state of the at least one of the integrating stage and comb filter state to modify the at least one internal state of the at least one of the integrating stage and comb filter stage of the CIC filter.

In certain embodiments, the one or more correction factors may include at least one of a linear, quadratic, and cubic correction factor. In addition, in some embodiments, the integrating stage may include one or more integrators coupled in series, and the comb filter stage may include one or more comb filters coupled in series.

In some embodiments, the comb filter stage operates at the second sampling rate and the integrating stage operates at a third sampling rate that is an integer ratio of the second sampling rate, wherein data output by the integrating stage is downsampled by sampling the data output by the integrating stage at the second sampling rate. In other embodiments, the integrating stage operates at the second sampling rate and the comb filter stage operates at a third sampling rate that is an integer ratio of the second sampling rate, wherein data output by the comb filter stage is upsampled by sampling the data output by the comb filter stage at the second sampling rate.

In some embodiments, the control block may include a processor. In another embodiment, the control block may include a hardware logic block packaged with the CIC filter.

According to a further embodiment, a sample rate converter (SRC) may include an input node for receiving an input signal at a first sample rate; an integrating stage coupled to the input node, wherein the integrating stage comprises a plurality of integrators; a comb filter stage coupled to the integrating stage, wherein the comb filter stage comprises a plurality of comb filters; an output node coupled to the comb filter stage; and/or a control block coupled to the integrating stage and configured to modify at least one internal state of the plurality of integrators such that an output signal at the output node is at a second sample rate unequal to the first sample rate. In certain embodiments, the control block generates one or more correction factors that when applied to the plurality of integrators cause the output node to output the output signal at the second sample rate; and/or the control block generates one or more correction factors that comprise at least one of a linear, quadratic, and cubic correction factor.

The foregoing has outlined rather broadly certain features and technical advantages of embodiments of the present invention in order that the detailed description that follows may be better understood. Additional features and advantages will be described hereinafter that form the subject of the claims of the invention. It should be appreciated by those having ordinary skill in the art that the conception and specific embodiment disclosed may be readily utilized as a basis for modifying or designing other structures for carrying out the same or similar purposes. It should also be realized by those having ordinary skill in the art that such equivalent constructions do not depart from the spirit and scope of the invention as set forth in the appended claims. Additional features will be better understood from the following description when considered in connection with the accompanying figures. It is to be expressly understood, however, that each of the figures is provided for the purpose of illustration and description only and is not intended to limit the present invention.

BRIEF DESCRIPTION OF THE DRAWINGS

For a more complete understanding of the disclosed system and methods, reference is now made to the following descriptions taken in conjunction with the accompanying drawings.

DETAILED DESCRIPTION

Non-integer sample rate conversion may be improved by configuring a CIC filter to operate as both a CIC filter and a non-integer SRC. By configuring a CIC filter to also perform non-integer sample rate conversion, the advantageous properties of CIC filters may be utilized to more effectively perform such complicated conversion as when the ratio of sample rates is a ratio of two large values. As an example, one advantageous characteristic of a CIC filter which can be exploited in configuring it to also operate as a SRC is the computational efficiency associated with CIC filters. In particular, as noted above, complicated non-integer sample rate conversion is computational intensive, especially when the ratio values are high. However, because a CIC filter can be developed with a combination of adder, substractor, and delay blocks, CIC filters have the inherent characteristic of being computationally efficient.

Figure 1:
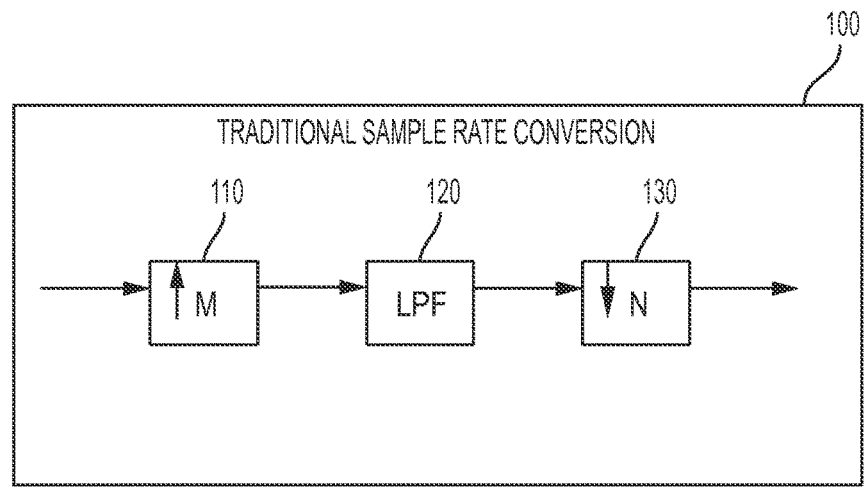
FIG. 1 is an example schematic block diagram illustrating a sample rate conversion scheme according to the prior art.
Figure 2:
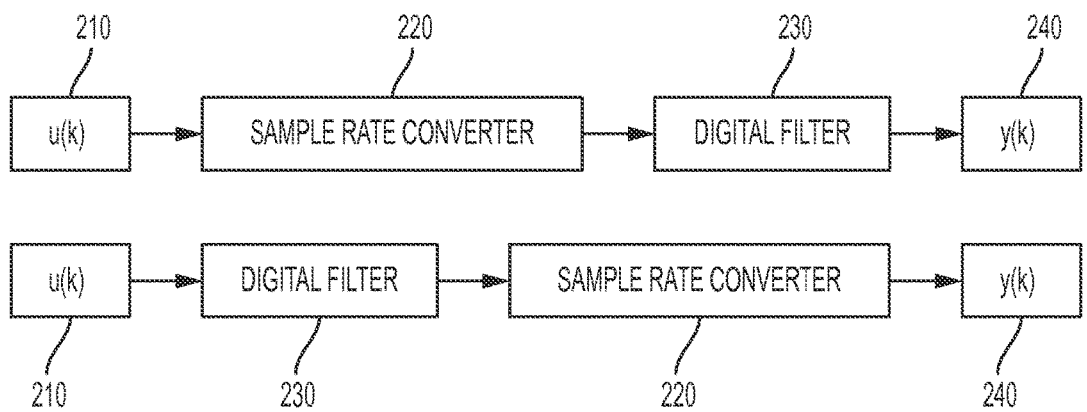
FIG. 2 is an example schematic block diagram illustrating how sample rate conversion and digital filtering are performed as separate steps according to the prior art.
Figure 3:
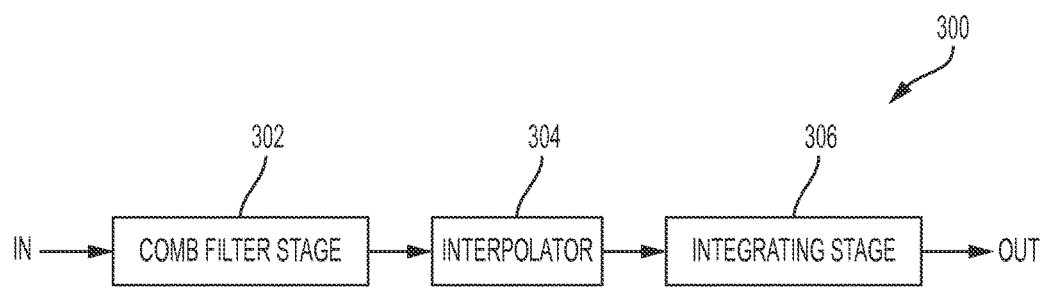
FIG. 3 is an example schematic block diagram of a CIC filter according to the prior art.
Figure 4:
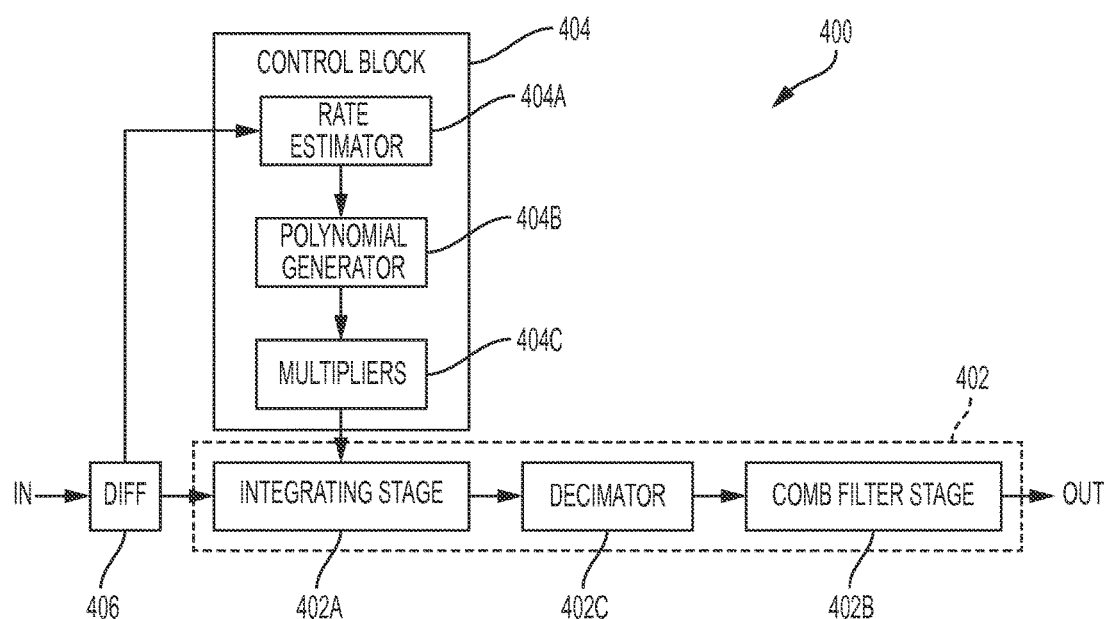
FIG. 4 is an example schematic block diagram illustrating a CIC filter configured to operate as a non-integer SRC according to one embodiment of the disclosure.

FIG. 4 is an example block diagram illustrating a CIC filter configured to operate as a non-integer SRC according to one embodiment of the disclosure. The CIC-SRC filter 400 includes a CIC filter 402, a control block 404, and a differentiator block 406. In particular, the CIC filter 402 includes an integrating stage 402A, a comb filter stage 402B, and a resampling block 402C, which in the embodiment of FIG. 4 is a decimator. The control block 404 includes a rate estimator block 404A, a polynomial generator block 404B, and a multiplier block 404C. As illustrated in FIG. 4, the CIC-SRC filter 400 also includes a differentiator block 406 to determine the input timing step size. In some embodiments, the differentiator block 406 may also be encompassed within the control block 404. When operated in accordance with embodiments of this disclosure, the control block 404 and differentiator block 406 may modify the operation of the CIC filter 402 to operate as a non-integer sample rate converter (SRC).

Figure 5:
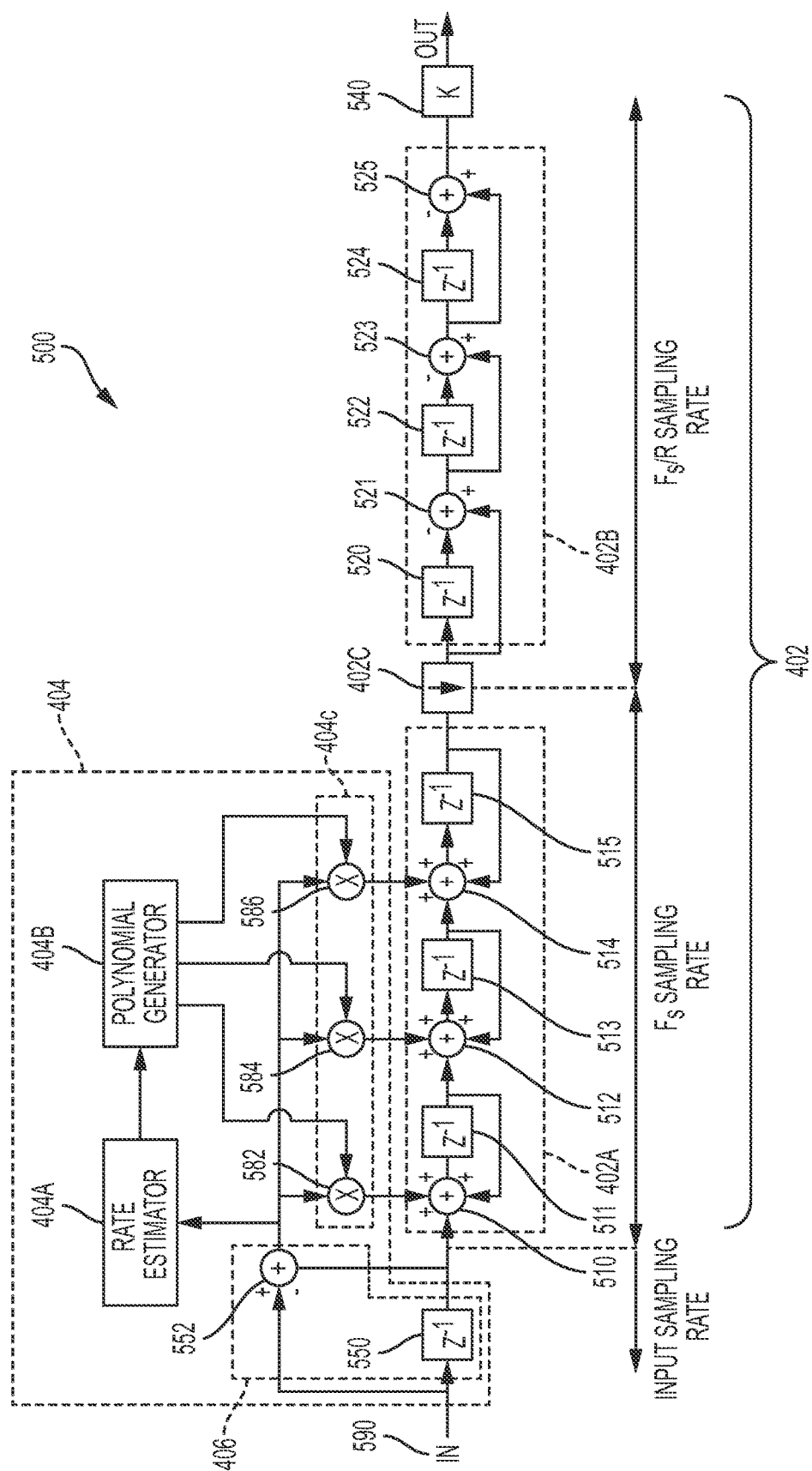
FIG. 5 is an example schematic block diagram illustrating a CIC filter operating as a non-integer SRC according to one embodiment of the disclosure.

FIG. 5 is an example block diagram illustrating details of a CIC filter, similar to that illustrated in FIG. 4, operating as a non-integer SRC according to one embodiment of the disclosure. Accordingly, the combined CIC filter and SRC system 500 illustrated in FIG. 5 includes the CIC filter 402 and the control block 404 configured to modify the CIC filter 402 to function as a SRC. As illustrated in the embodiment of FIG. 5, the differentiator block 406 in system 500 is encompassed within the control block 404. However, as illustrated in FIG. 4, in some embodiments, the differentiator block 406 may also be an external block operating in collaboration with the control block 404.

Referring to the specifics of FIG. 5, the CIC filter 402 illustrated in FIG. 5 includes a cascade of an integrating stage 402A and a comb filter stage 402B. In some embodiments, the system of FIG. 5 that includes the CIC filter 402 and control block 404 may be implemented in hardware and/or software using modular arithmetic techniques. Because modular operations may be used to limit high values, the modular arithmetic techniques utilized to implement system 500 may reduce the computational intensity of operations performed by the system 500, especially when intermediate values have the potential to be extremely high.

The integrating stage 402A of the CIC filter 402 illustrated in FIG. 5 includes adders 510, 512, and 514, and delay blocks 511, 513, and 515. The number of pairs of adders and delay blocks may indicate the order of the integrating stage 402A. For example, in FIG. 5 the integrating stage 402A includes three pairs of adders and delay blocks, where adder 510 and delay block 511 make up a first pair, adder 512 and delay block 513 make up a second pair, and adder 514 and delay block 515 make up a third pair. Thus, the integrating stage 402A illustrated in FIG. 5 is a third-order integrating stage. A single adder-delay block pair may be referred to as an integrator, thus, in FIG. 5, the integrating stage 402A may be said to include three integrators coupled in series. Although the integrators illustrated in FIG. 5 are delaying integrators, in some embodiments, the integrators may be zero-delay integrators.

The comb filter stage 402B of the CIC filter 402 illustrated in FIG. 5 includes delay blocks 520, 522, and 524, and subtractors 521, 523, and 525. Like the integrating stage 402A, the number of pairs of subtractors and delay blocks may indicate the order of the comb filter stage 402B. For example, in FIG. 5 the comb filter stage 402B includes three pairs of subtractors and delay blocks, where delay block 520 and subtractor 521 make up a first pair, delay block 522 and subtractor 523 make up a second pair, and delay block 524 and subtractor 525 make up a third pair. Thus, the comb filter stage 402B illustrated in FIG. 5 is a third-order comb filter stage 402B. A single subtractor-delay block pair may be referred to as a comb filter; thus, in FIG. 5, the comb filter stage 402B may be said to include three comb filters coupled in series. Although the comb filters illustrated in FIG. 5 are delaying comb filters, in some embodiments, the comb filters may be zero-delay comb filters.

As illustrated in FIG. 5, a CIC filter 402 typically includes the same number of integrators as comb filters. Thus, the order of a CIC filter 402 may indicate the order of the integrating stages 402A and comb filter stages 402B. For example, the CIC filter 402 illustrated in FIG. 5 may be referred to as a third-order CIC filter, indicating that the integrating stage 402A is of a third order and that the comb filter stage 402B is also of a third order. Although a third-order CIC filter 402 is illustrated in FIG. 5, one of skill in the art will readily recognize that the CIC filter 402 may be of any order without departing from this disclosure in spirit or scope. For example, in another embodiment, the CIC filter 402 may be a second order filter, in which the integrating stage 402A includes two integrators coupled in series and the comb filter stage 402B includes two comb filters coupled in series.

The CIC filter 402 illustrated in FIG. 5 also includes a resampling block 402C to implement a first level of resampling. The resampling block 402C may be an upsampling block or a downsampling block, depending on whether the CIC filter 402 is configured to upsample or downsample. In the embodiment of FIG. 5, the resampling block 402C is a downsampling block because the CIC filter 402 illustrated in FIG. 5 is configured to operate as a decimating CIC filter. A decimating CIC filter, as illustrated in FIG. 5, processes a data sequence first by an integrating stage 402A, after which a downsampling block, such as downsampling block 402C, downsamples the output of the integrating stage 402A to provide the comb filter stage 402B with a lower-sample-rate data sequence to process. As a result, the output of a decimating CIC filter 402 may be a filtered and downsampled data sequence.

The CIC filter 402 may be configured to operate as an interpolating CIC filter. An interpolating CIC filter may simply be the reverse architecture of a decimating CIC filter, with the resampling block performing an upsampling operation instead of a downsampling operation. Thus, an interpolating CIC filter may process a data sequence first by a comb filter stage, after which an upsampling block upsamples the output of the comb filter stage to provide the subsequent integrating stage with a higher-sample-rate data sequence to process. As a result, the output of an interpolating CIC filter may be a filtered and upsampled data sequence.

The CIC filter 402 may include a scaling factor that is applied to the data sequence before being output. For example, in the embodiment of FIG. 5, the CIC filter 402 includes a scaling block 540 to apply scaling factor K to the data sequence. In general, the scaling factor may be utilized for a variety of reasons, such as, for example, to correct attenuation or gain in the CIC filter 402, to improve stability of the CIC filter 402, or to prevent non-linearity.

When a CIC filter includes a resampling block between an integrating stage and a comb filter stage, blocks within a CIC filter may operate at different sampling rates. For example, in the CIC filter 402 illustrated in FIG. 5 in which the CIC filter 402 is operating as a decimating CIC filter 402, the blocks 520-525 of the comb filter stage 402B may operate at a second sample rate, such as a sample rate Fs/R, while the blocks of the integrating stage 402A operate at a third sampling rate that is an integer ratio of the second sampling rate, such as Fs. In one embodiment, the downsampling block 402C may downsample the data output by the integrating stage 402A by sampling the data output by the integrating stage 402A at the second sampling rate.

In another embodiment in which a CIC filter operates as an interpolating CIC filter, the blocks of the integrating stage may operate at a second sample rate, such as a sample rate Fs, while the blocks of the comb filter stage operate at a third sampling rate that is an integer ratio of the second sampling rate, such as Fs/R. In one embodiment, an upsampling block may upsample the data output by the comb filter stage by sampling the data output by the comb filter stage at the second sampling rate.

Filtering by the CIC filter 402 may be implemented through careful selection of the order of the CIC filter 402 and scaling blocks (gain blocks) used in the CIC filter 402. For example, the integrators of the integrating stage 402A may be selected to set the poles of the CIC filter 402 and the comb filters of the comb filter stage 402B may be selected to set the zeros of the CIC filter 402. Together, the poles and zeros combine to establish the transfer function implemented by the CIC filter 402.

FIG. 5 also illustrates one embodiment of a control block 404 used to configure a CIC filter 402 to operate as a non-integer SRC. In particular, the control block 404 includes differentiator block 406, rate estimator block 404A, polynomial generator block 404B, and multiplier block 404C.

When employing the CIC filter 402 for sample rate conversion, subtractor 552 and delay block 550 of differentiator block 406 of control block 404 may be employed to calculate a difference in samples of the input data from one sample point to a subsequent sample point. The delay block 550 may operate at the same sample rate at which the first stage of the CIC filter 402 operates or at an integer fraction of the sample rate at which the first stage of the CIC filter 402 operates, either of which may be referred to as a first sample rate. For example, if the first stage is an integrating stage 402A operating at a sampling rate of Fs, as is illustrated in FIG. 5, then the delay block 550 may also operate at a sampling rate of Fs or an integer fraction of Fs. Similarly, if the first stage is a comb filter stage operating at a sampling rate of Fs/R, then the delay block 550 may also operate at a sampling rate of Fs/R or an integer fraction of Fs/R. In some embodiments, the delay block 550 may operate at the same or fractional sampling rate as the first stage of the CIC filter 402, such as by the delay block 550 operating on a clock provided by the same clock crystal that provides the clock for the first stage of the CIC filter 402.

Regardless of how the delay block 550 is clocked, in some embodiments, there may exist a slight offset between the timing at which the input data sequence 390 is provided and the timing of the CIC filter 402. For example, the timing offset may exist even if the delay block 550 is clocked with the same clock crystal as the CIC filter 402 because the source of the input data sequence 590 is not synchronized with the clock of the CIC filter 402. In another example, the timing offset may manifest itself as a modification of the decimation or interpolation sought by the CIC filter 402. For example, when the CIC filter 402 is operating as a decimating CIC filter 402 with the downsampling block 402C set to have a downsampling ratio of 1/16, the actual ratio of the sample rate of the output data sequence to the input data sequence may be 1/15.9 because of the timing offset between the input data sequence and the first stage of the CIC filter 402. Similarly, as an interpolating CIC filter with the upsampling block set to have an upsampling ratio of 8/1, the actual ratio of the sample rate of the output data sequence to the input data sequence may be 7.9/1 because of the timing offset between the input data sequence and the first stage of the CIC filter. Thus, subtractor 552 and delay block 550 may be employed to calculate a difference in samples of the input data from one sample point to a subsequent sample point.

Based on at least the calculated first sampling rate and/or the difference in samples of the input data from one sample point to a subsequent sample point, the control block 404 may determine a timing offset between the sampling rate of the input data sequence (first sampling rate) and the sampling rate of the first stage of the CIC filter 402, which may be a ratio of the sampling rate of the output data sequence (second sampling rate). For example, in FIG. 5, the control block 404 includes rate estimator block 404A, which may implement the hardware, software, and/or memory logic needed to determine the timing offset between the first sampling rate and the sampling rate of the first stage of the CIC filter 402, which may be a ratio of the output sampling rate.

Based, at least in part, on the determined timing offset between the input data sequence sampling rate and a ratio of the output data sequence sampling rate, the control block 404 may generate one or more correction factors. For example, in FIG. 5, the control block includes polynomial generator 404B, which may implement the hardware, software, and/or memory logic needed to generate the one or more correction factors based on the timing offset between the input data sequence sampling rate and a ratio of the output data sequence sampling rate. As illustrated in FIG. 5, there may be three correction factors generated by the polynomial generator block 404B when the CIC filter 402 is a third-order filter. Thus, in some embodiments, the number of correction factors generated by the polynomial generator block 404B may be less than or equal to the order of the CIC filter 402. However, in some embodiments, not all correction factors may be used to modify the internal states of the first stage of the CIC filter 402. For example, even when the CIC filter 402 is a third-order filter for which three correction factors are generated, the number of correction factors that are used to modify the CIC filter 402 properties may be less than three.

As one example of rate estimation, such as that performed by rate estimator block 404A, and polynomial correction factor generation, such as that performed by polynomial generator block 404B, a computer program listing appendix is provided herewith the Instant Application. More broadly, the computer program listing appendix provides an example of the functioning of and interaction between the differentiator block 406, control block 404, and integrator stage 402A of a third-order CIC filter configured to operate as a non-integer SRC.

Figure 7:
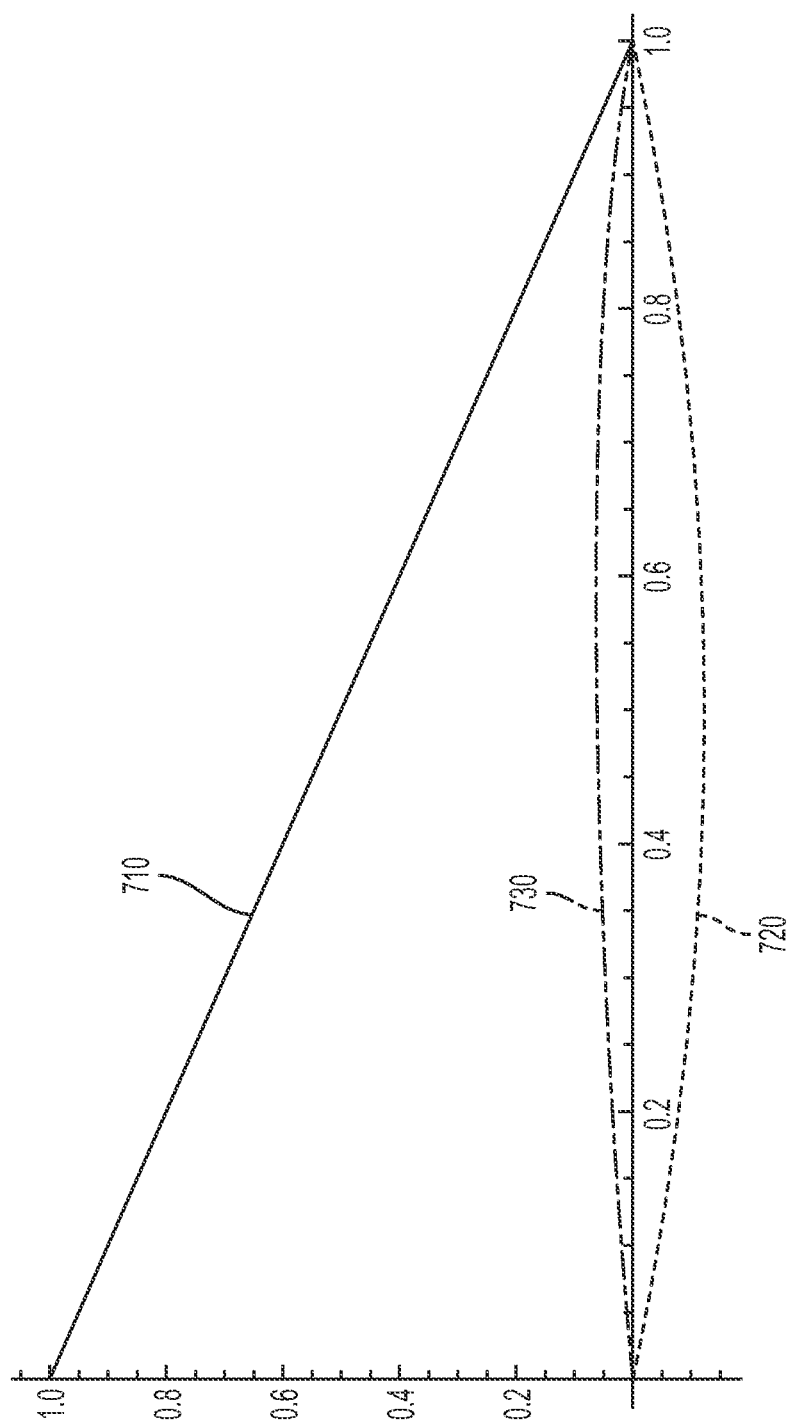
FIG. 7 is an example illustration of values that the correction factors of a third-order CIC filter configured to operate as a non-integer SRC may take and the relationship between the correction factors according to one embodiment of the disclosure.

The one or more correction factors may include at least one of a linear, quadratic, and cubic correction factor. For example, the correction factor that is applied to multiplier 582 may be a linear correction factor, the correction factor that is applied to multiplier 584 may be a quadratic correction factor, and the correction factor that is applied to multiplier 586 may be a cubic correction factor. As one example, FIG. 7 provides an illustration of values that the correction factors of a third-order CIC filter configured to operate as a non-integer SRC may take and the relationship between the correction factors. Correction factor 710 illustrates the linear correction factor that can be applied to multiplier 582, correction factor 720 illustrates the quadratic correction factor that can be applied to multiplier 584, and correction factor 730 illustrates the cubic correction factor that can be applied to multiplier 586.

According to some embodiments, the operations performed by the rate estimator block 404A and polynomial generator block 404B may include analysis of one or more lookup tables. In another embodiment, the operations performed by the rate estimator block 404A and polynomial generator block 404B may include customized algorithms.

As illustrated in FIG. 5, the control block includes multipliers 582, 584, and 586 to multiply each of the one or more correction factors by the difference in samples of the input data obtained at the output of subtractor 552 by sampling the input data samples at the first sampling rate, that is, the input sampling rate. The result of the multiplication may be the generation of one or more input correction samples corresponding to the one or more correction factors.

The resulting one or more input correction samples may be independently added to an internal state of each integrator or comb filter block of the CIC filter 402, whichever is part of the first stage of the CIC filter 402. For example, in the embodiment of FIG. 5, the first stage is the integrating stage 402A, thus the one or more input correction samples may be independently added to an internal state of each integrator in the integrating stage 402A by adding each input correction sample to the adder block of a distinct integrator, such as adders 510, 512, and 514. However, if the first stage of the CIC filter is the comb filter stage, such as when the CIC filter is an interpolating CIC filter, the one or more input correction samples may be independently added to an internal state of each comb filter in the comb filter stage by adding each input correction sample to the adder block of a distinct comb filter. As noted previously, not all blocks of the first stage of the CIC filter may be modified with an input correction sample; thus in some embodiments, modifying the first stage of the CIC filter 402 may include adding the one or more of the input correction samples to one or more internal states of the first stage of the CIC filter 402.

As noted previously, through selection of the poles and zeros set by the integrating stages and comb filter stages, respectively, and of scaling applied in the signal path using one or more gain blocks, the CIC filter 402 may also be configured to filter the input data sequence 590 provided at the input sample rate. In addition, adding the input correction samples to one or more internal states of the first stage of the CIC filter 402 may modify the one or more internal states of the first stage of the CIC filter 402. As a result of the filtering of the input data samples by the CIC filter 402 and modification of the CIC filter 402 by the control block 404, the CIC filter 402 may be configured to perform filtering and non-integer sample rate conversion to output data samples at an output sample rate that is unequal to and a non-integer ratio of the input sample rate.

In some embodiments, one or more aspects of system 500 may be implemented in hardware, software, or a combination of hardware and software. For example, the entire system may be implemented in hardware. In some embodiments, the implementation in hardware may be through a hardware description language, such as VHDL. In another embodiment, the CIC filter 402 and control block 404 may be separate hardware block, while in yet another embodiment, the control block 404 may be a logic block packaged with the CIC filter 402. In another embodiment, both the CIC filter 402 and control block 404 may be implemented in software. For example, the CIC filter 402 and/or control block 404 may include a processor configured to execute the functions of the CIC filter 402 and/or control block 404. Other configurations may be utilized to implement system 500 without departing from this disclosure in spirit or scope so long as the configurations are able to implements the functions of a CIC filter and control block as disclosed herein.

In view of exemplary systems shown and described herein, methodologies that may be implemented in accordance with the disclosed subject matter will be better appreciated with reference to various functional block diagrams. While, for purposes of simplicity of explanation, methodologies are shown and described as a series of acts/blocks, it is to be understood and appreciated that the claimed subject matter is not limited by the number or order of blocks, as some blocks may occur in different orders and/or at substantially the same time with other blocks from what is depicted and described herein. Moreover, not all illustrated blocks may be required to implement methodologies described herein. It is to be appreciated that functionality associated with blocks may be implemented by software, hardware, a combination thereof or any other suitable means (e.g. device, system, process, or component). Additionally, it should be further appreciated that methodologies disclosed throughout this specification are capable of being stored on an article of manufacture to facilitate transporting and transferring such methodologies to various devices. Those skilled in the art will understand and appreciate that a methodology could alternatively be represented as a series of interrelated states or events, such as in a state diagram.

Figure 6:
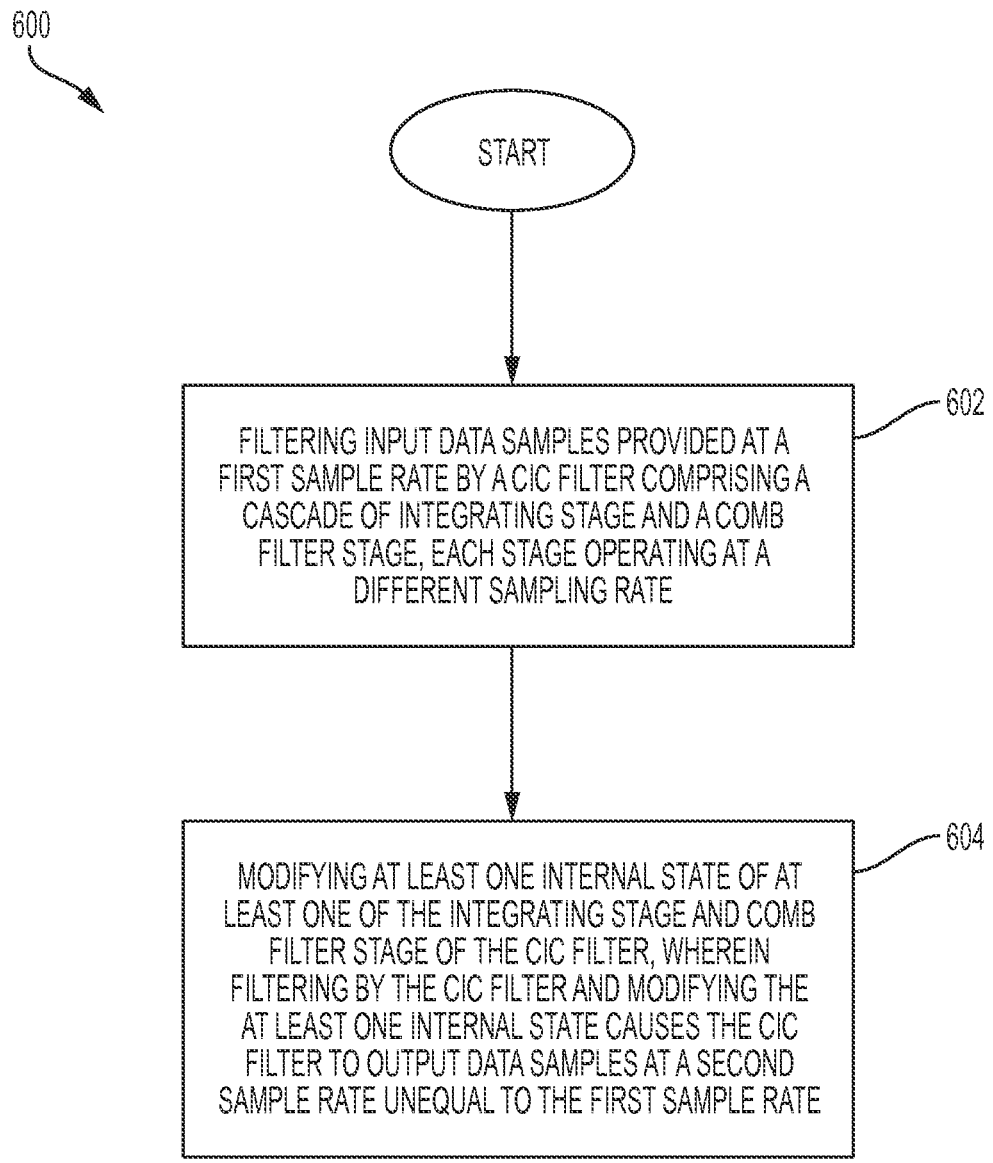
FIG. 6 is an example flow chart illustrating a method for converting input data samples provided at a first sample rate to output data samples at a second sample rate unequal to the first sample rate using a CIC filter according to one embodiment of the disclosure.

FIG. 6 is a flow chart illustrating a method for converting input data samples provided at a first sample rate to output data samples at a second sample rate unequal to the first sample rate using a CIC filter operating as a non-integer SRC according to one embodiment of the disclosure. It is noted that embodiments of method 600 may be implemented in accordance with the systems and embodiments described herein with respect to FIGS. 4-5. For example, embodiments of method 600 may be implemented by systems 400 and 500 that include at least a CIC filter 402 and a control block 404 for modifying the CIC filter 402 to perform complicated non-integer sample rate conversion. In general, embodiments of method 600 may be implemented by other similar systems without deviating from this disclosure so long as the systems, whether directly or indirectly, support the operations as described herein.

Specifically, method 600 includes, at block 602, filtering input data samples provided at a first sample rate by a CIC filter that includes a cascade of an integrating stage and a comb filter stage, each stage operating at a different sampling rate. For example, as noted with respect to FIG. 5, through selection of the poles and zeros for the CIC filter transfer function by setting the integrating stage 402A and comb filter stage 402B, respectively, and selection of the scaling applied in the signal path using one or more gain blocks, the CIC filter 402 may be configured to filter the input data sequence 590 provided at the input sample rate. In addition, as described in the description of FIG. 5, the integrating stage 402A and comb filter stage 402B may operate at different sample rates that are ratios of each other, such as the ratio of the resampling block 402C of the CIC filter 402. In some embodiments, the first sample rate may refer to the sample rate of the input data sequence, which may have a slight timing offset from the sampling rate of the first stage of the CIC filter 402. For example, when the first stage of the CIC filter 402 operates at a sampling rate of 384 KHz, the input data sequence may correspond to a sampling rate of 384.1 KHz.

At block 604, method 600 includes modifying at least one internal state of at least one of the integrating stage and comb filter stage of the CIC filter. Together, the filtering by the CIC filter and the modifying of the at least one internal state may cause the CIC filter to output data samples at a second sample rate unequal to the first sample rate. For example, continuing with the example in which the first stage of the CIC filter operates at a sampling rate of 384 KHz, the output sampling rate may be 384/8=48 KHz. Thus, continuing with the example, the filtering by the CIC filter and the modifying of the at least one internal state may cause the CIC filter to output data samples, which were received at a rate of 384.1 KHz, at an output sample rate of 48 KHz.

As indicated in the description of FIG. 5, modifying may include calculating the first sampling rate and determining a timing offset between the first sampling rate and a ratio of the second sampling rate based, at least in part, on the calculated first sampling rate. In the example given above, the timing offset would be 100 Hz. Modifying may also include generating one or more correction factors based, at least in part, on the determined timing offset between the first sampling rate and a ratio of the second sampling rate. In some embodiments, the one or more correction factors may include at least one of a linear, quadratic, and cubic correction factor.

Modifying may further include multiplying a difference in samples of the input data, obtained by sampling the input data samples at the first sampling rate, by each of the one or more correction factors to generate one or more input correction samples corresponding to the one or more correction factors. To complete the modification of the CIC filter, modifying may include, as illustrated in FIG. 5, adding the one or more input correction samples to one or more of the at least one internal state of the at least one of the integrating stage and comb filter state to modify the at least one internal state of the at least one of the integrating stage and comb filter stage of the CIC filter.

The schematic flow chart diagram of FIG. 6 is generally set forth as a logical flow chart diagram. As such, the depicted order and labeled steps are indicative of aspects of the disclosed method. Other steps and methods may be conceived that are equivalent in function, logic, or effect to one or more steps, or portions thereof, of the illustrated method. Additionally, the format and symbols employed are provided to explain the logical steps of the method and are understood not to limit the scope of the method. Although various arrow types and line types may be employed in the flow chart diagram, they are understood not to limit the scope of the corresponding method. Indeed, some arrows or other connectors may be used to indicate only the logical flow of the method. For instance, an arrow may indicate a waiting or monitoring period of unspecified duration between enumerated steps of the depicted method. Additionally, the order in which a particular method occurs may or may not strictly adhere to the order of the corresponding steps shown.

If implemented in firmware and/or software, functions described above may be stored as one or more instructions or code on a computer-readable medium. Examples include non-transitory computer-readable media encoded with a data structure and computer-readable media encoded with a computer program. Computer-readable media includes physical computer storage media. A storage medium may be any available medium that can be accessed by a computer. Such computer-readable media can comprise random access memory (RAM), read-only memory (ROM), electrically-erasable programmable read-only memory (EEPROM), compact disc read-only memory (CD-ROM) or other optical disk storage, magnetic disk storage or other magnetic storage devices, or any other medium that can be used to store desired program code in the form of instructions or data structures and that can be accessed by a computer. Disk and disc includes compact discs (CD), laser discs, optical discs, digital versatile discs (DVD), floppy disks and Blu-ray discs. Generally, disks reproduce data magnetically, and discs reproduce data optically. Combinations of the above should also be included within the scope of computer-readable media.

In addition to storage on computer readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

Although the present disclosure and certain representative advantages have been described in detail, it should be understood that various changes, substitutions and alterations can be made herein without departing from the spirit and scope of the disclosure as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods, or steps, presently existing or later to be developed that perform substantially the same function or achieve substantially the same result as the corresponding embodiments described herein may be utilized. Accordingly, the appended claims are intended to include within their scope such processes, machines, manufacture, compositions of matter, means, methods, or steps.

What is claimed is:

1. An apparatus, comprising:
   a cascaded integrator-comb (CIC) filter comprising a cascade of an integrating stage and a comb filter stage, each stage operating at a different sampling rate, wherein the CIC filter is configured to filter input data samples provided at a first sample rate; and
   a control block coupled to the CIC filter, wherein the control block is configured to modify at least one internal state of at least one of the integrating stage and the comb filter stage of the CIC filter, wherein the control block is further configured to perform the steps of:
     calculating the first sampling rate; and
     determining a timing offset between the first sampling rate and a ratio of the second sampling rate based, at least in part, on the calculated first sampling rate, and
   wherein the CIC filter is further configured to, in response to modification by the control block and filtering of the input data samples, output data samples at a second sample rate unequal to the first sample rate.

2. The apparatus of claim 1, wherein the control block is further configured to perform the steps of:
   generating one or more correction factors based, at least in part, on the determined timing offset between the first sampling rate and a ratio of the second sampling rate; and
   multiplying a difference in samples of the input data, obtained by sampling the input data samples at the first sampling rate, by each of the one or more correction factors to generate one or more input correction samples corresponding to the one or more correction factors.

3. The apparatus of claim 2, wherein the control block is further configured to perform the step of:
   adding the one or more input correction samples to one or more of the at least one internal state of the at least one of the integrating stage and comb filter state to modify the at least one internal state of the at least one of the integrating stage and the comb filter stage of the CIC filter.

4. The apparatus of claim 2, wherein the one or more correction factors comprise at least one of a linear, quadratic, and cubic correction factor.

5. The apparatus of claim 1, wherein the integrating stage comprises one or more integrators coupled in series, and wherein the comb filter stage comprises one or more comb filters coupled in series.

6. The apparatus of claim 1, wherein the comb filter stage operates at the second sampling rate and the integrating stage operates at a third sampling rate that is an integer ratio of the second sampling rate, and wherein data output by the integrating stage is downsampled by sampling the data output by the integrating stage at the second sampling rate.

7. The apparatus of claim 1, wherein the integrating stage operates at the second sampling rate and the comb filter stage operates at a third sampling rate that is an integer ratio of the second sampling rate, and wherein data output by the comb filter stage is upsampled by sampling the data output by the comb filter stage at the second sampling rate.

8. The apparatus of claim 1, wherein the CIC filter and the control block are further configured to utilize modular arithmetic techniques while in operation.

9. A method, comprising:
   filtering input data samples provided at a first sample rate by a cascaded integrator-comb (CIC) filter comprising a cascade of an integrating stage and a comb filter stage, each stage operating at a different sampling rate; and
   modifying at least one internal state of at least one of the integrating stage and the comb filter stage of the CIC filter, wherein the step of modifying comprises:
     calculating the first sampling rate; and
     determining a timing offset between the first sampling rate and a ratio of the second sampling rate based, at least in part, on the calculated first sampling rate, and
   wherein filtering by the CIC filter and modifying the at least one internal state causes the CIC filter to output data samples at a second sample rate unequal to the first sample rate.

10. The method of claim 9, wherein the step of modifying further comprises:
    generating one or more correction factors based, at least in part, on the determined timing offset between the first sampling rate and a ratio of the second sampling rate; and
    multiplying a difference in samples of the input data, obtained by sampling the input data samples at the first sampling rate, by each of the one or more correction factors to generate one or more input correction samples corresponding to the one or more correction factors.

11. The method of claim 10, wherein modifying further comprises:
    adding the one or more input correction samples to one or more of the at least one internal state of the at least one of the integrating stage and comb filter state to modify the at least one internal state of the at least one of the integrating stage and the comb filter stage of the CIC filter.

12. The method of claim 10, wherein the one or more correction factors comprise at least one of a linear, quadratic, and cubic correction factor.

13. The method of claim 9, wherein the comb filter stage operates at the second sampling rate and the integrating stage operates at a third sampling rate that is an integer ratio of the second sampling rate, and wherein data output by the integrating stage is downsampled by sampling the data output by the integrating stage at the second sampling rate.

14. The method of claim 9, wherein the integrating stage operates at the second sampling rate and the comb filter stage operates at a third sampling rate that is an integer ratio of the second sampling rate, and wherein data output by the comb filter stage is upsampled by sampling the data output by the comb filter stage at the second sampling rate.

15. The method of claim 9, wherein the method is performed using modular arithmetic techniques.

16. A sample rate converter (SRC), comprising:
   an input node for receiving an input signal at a first sample rate;
   an integrating stage coupled to the input node, wherein the integrating stage comprises a plurality of integrators;
   a comb filter stage coupled to the integrating stage, wherein the comb filter stage comprises a plurality of comb filters;
   an output node coupled to the comb filter stage; and
   a control block coupled to the integrating stage and configured to modify at least one internal state of the plurality of integrators such that an output signal at the output node is at a second sample rate unequal to the first sample rate, wherein the control block is configured to modify the at least one internal state by performing steps comprising:
   calculating the first sampling rate; and
   determining a timing offset between the first sampling rate and a ratio of the second sampling rate based, at least in part, on the calculated first sampling rate.

17. The sample rate converter of claim 16, wherein the control block generates one or more correction factors that when applied to the plurality of integrators cause the output node to output the output signal at the second sample rate.

18. The sample rate converter of claim 17, wherein the control block generates one or more correction factors that comprise at least one of a linear, quadratic, and cubic correction factor.

* * * * *